United States Patent
Park et al.

(10) Patent No.: US 8,158,068 B2
(45) Date of Patent: Apr. 17, 2012

(54) PLASMA REACTOR

(75) Inventors: Kunjoo Park, Suwon-Si (KR);
Hwankook Chae, Suwon-Si (KR);
Sungyong Ko, Suwon-Si (KR);
Keehyun Kim, Suwon-Si (KR);
Weonmook Lee, Suwon-Si (KR)

(73) Assignee: DMS Co., Ltd., Suwon (KR)

( * ) Notice: Subject to any disclaimer, the term of this patent is extended or adjusted under 35 U.S.C. 154(b) by 360 days.

(21) Appl. No.: 12/416,658

(22) Filed: Apr. 1, 2009

(65) Prior Publication Data

US 2009/0280040 A1  Nov. 12, 2009

(30) Foreign Application Priority Data

May 9, 2008  (KR) .................. 10-2008-0043422

(51) Int. Cl.
*B01J 19/08* (2006.01)
(52) U.S. Cl. .................................. 422/186; 422/186.14
(58) Field of Classification Search ............. 422/186.14, 422/186, 186.01, 186.03, 186.04, 186.05
See application file for complete search history.

(56) References Cited

U.S. PATENT DOCUMENTS

2002/0142593 A1* 10/2002 Langley et al. ............... 438/689

FOREIGN PATENT DOCUMENTS

KR  10-20020-7008049  6/2002

* cited by examiner

*Primary Examiner* — Natalia Levkovich
(74) *Attorney, Agent, or Firm* — IPLA P.A.; James E. Bame

(57) ABSTRACT

A plasma chemical reactor is provided. The reactor includes a chamber, a cathode assembly, and a baffle plate. The chamber forms a plasma reaction space. The cathode assembly includes a cathode support shaft and a substrate support. The cathode support shaft is coupled at one side to a wall surface of the chamber. The substrate support is coupled to the other side of the cathode support shaft and supports the substrate. The baffle plate is out inserted and coupled to the substrate support, and has a plurality of vents arranged to be spaced apart and through formed such that reaction gas can pass through, and the vents asymmetrically arranged and formed to get a vent area smaller at an opposite side than a top side of the cathode support shaft.

5 Claims, 8 Drawing Sheets

US 8,158,068 B2

PLASMA REACTOR

CROSS REFERENCE

This application claims foreign priority under Paris Convention and 35 U.S.C. §119 to each of Korean Patent Application No. 10-2008-0043422 filed on May 9, 2008 with the Korean Intellectual Property Office.

BACKGROUND OF THE INVENTION

1. Field of the Invention

The present invention relates to a plasma reactor for processing a large-sized wafer. More particularly, the present invention relates to a plasma reactor constructed to have a chamber, a cathode assembly supported on a one side wall surface of the chamber in a cantilever form and supporting a substrate, and a baffle plate for discharging reaction gas. The baffle plate enables asymmetric arrangement of vents for discharging reaction gas and enables uniform discharge of exhaust gas even in the cathode assembly of an asymmetric structure, thereby improving the uniformity of plasma within the chamber and improving the uniformity of a substrate etching rate in an etching process, etc.

2. Description of the Related Art

In general, a large-sized wafer that is used for a semiconductor Integrated Circuit (IC) device or a glass substrate that is a main part used for Liquid Crystal Display (LCD), etc. forms several thin film layers on its surface and, by selectively removing only a portion of the thin film, forms a hyperfine structure of a desired form on the surface, thus forming a complex circuit or thin film layer. At this time, thin film manufacturing is implemented through many manufacturing processes such as a washing process, a deposition process, a photolithography process, a plating process, an etching process, etc.

The aforementioned various processes are mainly implemented within a chamber or reacting furnace that is a processing device for isolating a wafer or substrate from the external.

Among the aforementioned processes, particularly, the etching process is a process of removing target materials from a wafer surface through a chemical reaction of a plasma state by jetting reaction gas (i.e., $CF_4$, $Cl_2$, HBr, etc.) within the chamber or reacting furnace. The etching process selectively removes a portion not covered with photoresist using a photoresist pattern as a mask, thus forming a fine pattern on the substrate. Thus, it is of most importance to keep etching uniformity for the whole substrate surface.

Thus, to improve etching uniformity and prevent process badness, plasma formed within the chamber should be kept uniform and get in contact with the whole substrate surface.

However, in the conventional plasma chemical reactor, the cathode assembly is installed in a left/right asymmetric structure within the chamber because the cathode assembly supporting the substrate is supported in a cantilever form by a cathode support shaft installed at a one side wall surface of the chamber. So, the following problems occur.

The first problem is that, when reaction gas generated after plasma reaction, polymer, or particles are discharged below the chamber, it is obstructed by the cathode support shaft supporting the cathode assembly, thus disabling uniform effective discharge of exhaust gas along the periphery of the cathode assembly. The second problem is that, when reaction gas is discharged, it is obstructed by the cathode support shaft at one side and, because the reaction gas is non-uniformly discharged, plasma cannot be uniformly formed on a substrate surface, thus causing the non-uniformity of an etching rate in an etching process, etc.

SUMMARY OF THE INVENTION

An aspect of exemplary embodiments of the present invention is to address at least the problems and/or disadvantages and to provide at least the advantages described below. Accordingly, an aspect of exemplary embodiments of the present invention is to enable uniform effective discharge of reaction gas along the periphery of a substrate support within a chamber by installing a baffle plate for discharging reaction gas along the periphery of the substrate support and asymmetrically arranging and forming vents in the baffle plate such that the reaction gas can be discharged uniformly.

Another aspect of exemplary embodiments of the present invention is to, by keeping plasma on a substrate surface uniform, keep the uniformity of an etching rate on the whole substrate surface in an etching process, etc. and improve process uniformity.

According to one aspect of the present invention, a plasma reactor is provided. The plasma reactor includes a chamber, a cathode assembly, and a baffle plate. The chamber forms a plasma reaction space. The cathode assembly includes a cathode support shaft and a substrate support. The cathode support shaft is coupled at one side to a wall surface of the chamber. The substrate support is coupled to the other side of the cathode support shaft and supports the substrate such that a substrate is positioned at a center inside the chamber. The baffle plate is out inserted and coupled to the substrate support such that a reaction space of the chamber is divided into upper and lower parts, and has a plurality of vents arranged to be spaced apart and through formed such that reaction gas can pass through. The vents are asymmetrically arranged and formed to get a vent area smaller at an opposite side than a top side of the cathode support shaft.

The vents of the baffle plate may be comprised of a plurality of slots that are arranged to be spaced apart in a radial shape. A spaced distance between the slots may be formed larger at the opposite side than the top side of the cathode support shaft.

The vents are comprised of a plurality of slots that are arranged at an equal interval to be spaced apart in a radial shape. A slot length may get smaller in regular sequence at the opposite side than the top side of the cathode support shaft and thus, a profile of the whole slots may be formed in an oval shape.

The vents may be comprised of a plurality of slots that are arranged at an equal interval to be spaced apart in a radial shape. A slot length may get smaller in regular sequence from the inside at the opposite side than the top side of the cathode support shaft and thus, a center point of the whole slots may be positioned eccentrically to the opposite side of the cathode support shaft.

The vents may be comprised of a plurality of holes that are arranged to be spaced apart. A spaced distance between the holes may be formed larger at the opposite side than the top side of the cathode support shaft.

According to another aspect of the present invention, there is provided a plasma reactor. The plasma reactor includes a chamber, a cathode assembly, and a baffle plate. The chamber forms a plasma reaction space. The cathode assembly includes a cathode support shaft and a substrate support. The cathode support shaft is coupled at one side to a wall surface of the chamber. The substrate support is coupled to the other side of the cathode support shaft and supports the substrate such that a substrate is positioned at a center inside the chamber. The baffle plate is spaced apart up/down and is out inserted and coupled to the substrate support such that a reaction space of the chamber is divided into upper and lower parts. The baffle plate includes a first discharge plate and a second discharge plate, the first and second discharge plates having a plurality of vents that are arranged to be spaced apart and through formed such that reaction gas within the chamber can pass through. The first and second discharge plates are formed to have a different vent area through which the reaction gas passes through.

The first and second discharge plates of the baffle plate each may be formed and integrated at an upper end and a lower end of a support that is out inserted and coupled to the substrate support.

The vents of the first and second discharge plates may be each comprised of a plurality of slots that are arranged at an equal interval to be spaced apart in a radial shape. The first and second discharge plates may be formed to have a different slot interval.

The vents of the first and second discharge plates each may be comprised of a plurality of holes arranged to be spaced apart. At least any one of the first and second discharge plates may be formed to have a larger spaced distance between the holes at an opposite side than a top side of the cathode support shaft.

The vents of the first and second discharge plates may be each comprised of a plurality of slots arranged to be spaced apart in a radial shape. At least any one of the first and second discharge plates may be formed to have a larger spaced distance between the slots at an opposite side than a top side of the cathode support shaft.

The vents of the first and second discharge plates may be each comprised of a plurality of slots arranged to be spaced apart in a radial shape. At least any one of the first and second discharge plates may be formed such that a slot length gets smaller in regular sequence at an opposite side than a top side of the cathode support shaft and thus, a profile of the whole slots may be formed in an oval shape.

The vents of the first and second discharge plates may be each comprised of a plurality of slots arranged to be spaced apart in a radial shape. At least any one of the first and second discharge plates may be formed such that a slot length gets smaller in regular sequence from the inside at an opposite side than a top side of the cathode support shaft and thus, a center point of the whole slots may be positioned eccentrically to an opposite side of the cathode support shaft.

BRIEF DESCRIPTION OF THE DRAWINGS

The above and other objects, features and advantages of the present invention will become more apparent from the following detailed description when taken in conjunction with the accompanying drawings in which.

Throughout the drawings, the same drawing reference numerals will be understood to refer to the same elements, features and structures.

DETAILED DESCRIPTION OF THE INVENTION

Exemplary embodiments of the present invention will now be described in detail with reference to the annexed drawings. In the following description, a detailed description of known functions and configurations incorporated herein has been omitted for conciseness.

Figure 1:
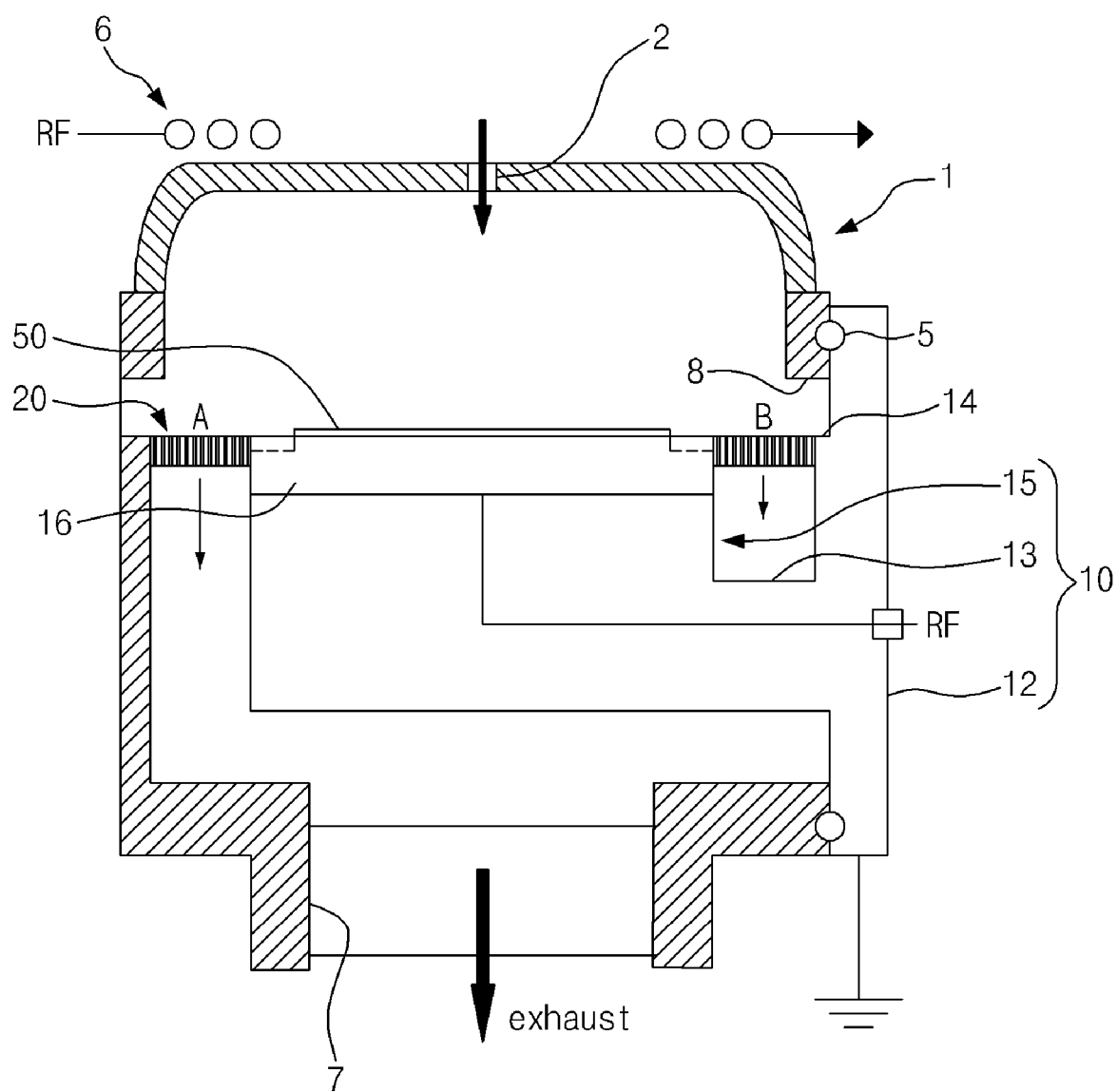
FIG. 1 is a schematic side section of an exemplary embodiment of the present invention.
Figure 2A:
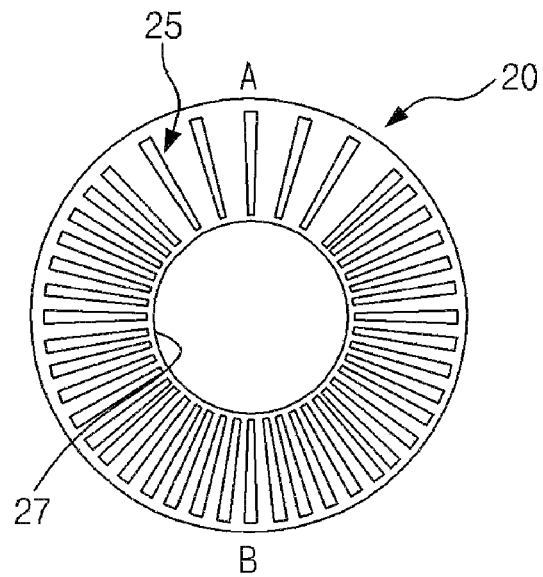
FIGS. 2A to 2C are plan views of respective different exemplary embodiments of a baffle plate of the present invention.
Figure 2B:
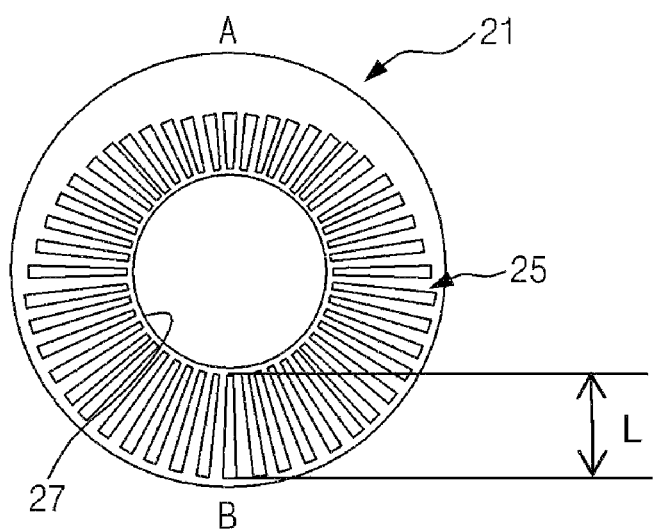
Figure 2C:
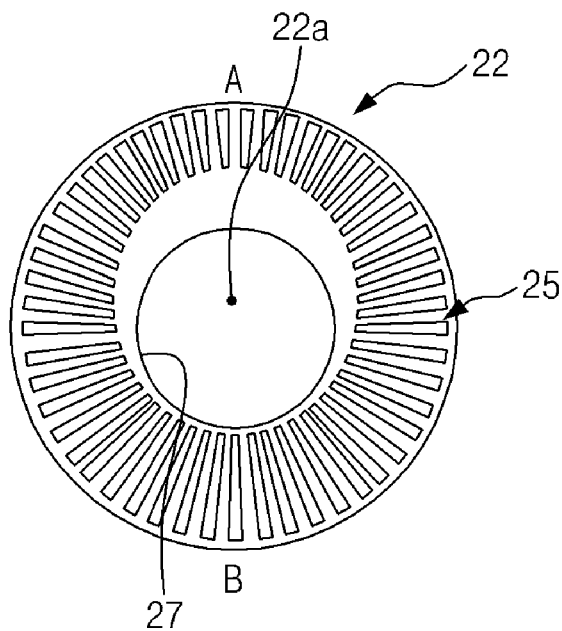

FIG. 1 is a schematic side section of an exemplary embodiment of the present invention. FIGS. 2A to 2C are plan views of respective different exemplary embodiments of a baffle plate.

As shown, an exemplary embodiment of the present invention includes a chamber 1 for providing a plasma reaction space, and a cathode assembly 10 and a baffle plate 20 installed within the chamber 1.

The chamber 1 forms the plasma reaction space therein. At a top and center of the chamber 1, a jet port 2 for jetting a reaction gas is formed. At a bottom and center of the chamber 1, an exhaust port 7 for exhausting the reaction gas to the external is formed.

A Radio Frequency (RF) top electrode 6 is provided over the chamber 1.

The cathode assembly 10 supports a substrate 50 such that the substrate 50 can be positioned within the chamber 1 in a horizontal state, and simultaneously forms an RF bottom electrode. The cathode assembly includes a substrate support 15, a cathode support shaft 13, and a fixing plate 12.

The substrate support 15 supports the substrate 50 such that the substrate 50 can be positioned at a center inside the chamber 1. At an upper side of the substrate support 15, the bottom electrode 16 for placing the substrate 50 thereon is provided.

The bottom electrode 16 forms an RF cathode and converts the reaction gas jetted within the chamber 1 into a plasma state such that a surface of the substrate 50 is processed by plasma.

RF powers each connect to the top electrode 6 over the chamber 1 and the bottom electrode 16 and apply an RF current, thus converting the reaction gas into a plasma state.

Reaction gas is jetted into the chamber 1 through the jet port 2 that is formed on the same line as a center of the bottom electrode 16 such that plasma is uniformly formed on the surface of the substrate 50.

Accordingly, the reaction gas converts into a plasma state by the RF powers within the chamber 1, reacts with the surface of the substrate 50, processes the substrate 50, and is discharged out through the exhaust port 7 formed at a lower side of the chamber 1.

An electrostatic chuck (not shown) for fixing the substrate 50 can be provided at an upper part of the bottom electrode 16 to more stably fix the substrate 50. A gas pipe (not shown) for circulating helium (He) gas can be installed on an upper surface of the bottom electrode 16 or electrostatic chuck so as to cool the substrate 50.

The electrostatic chuck absorbs a target by an electric attractive force formed between an electrode surface and the target, using a potential difference of static electricity.

The cathode support shaft 13 supports the substrate support 15. The cathode support shaft 13 is coupled at one side to the fixing plate 12 and is coupled at the other side to the outer circumference of the substrate support 15, thus supporting the substrate support 15 in a cantilever form.

The fixing plate 12 is coupled to a one side wall surface of the chamber 1. The fixing plate 12 is coupled to an insertion hole 8 that is through formed at the one side wall surface of the chamber 1.

The fixing plate 12 and the insertion hole 8 of the chamber 1 can be formed in various shapes such as a circle, a square, etc.

The fixing plate 12 is formed larger than the insertion hole 8 and is screw-coupled along the periphery of the insertion hole 8. At this time, a sealing member 5 can be provided at a contact part with an outer circumference surface of the chamber 1 to prevent a leakage of reaction gas.

The baffle plate 20 enables plasma reaction gas to be discharged after staying at an upper part of the chamber 1 for a predetermined time. The baffle plate 20 is out inserted in the substrate support 15 of the cathode assembly 10 and is installed in a space part that is formed between an inner circumference surface of the chamber 1 and an outer circumference surface of the substrate support 15.

As illustrated in FIG. 2A, the baffle plate 20 is of a circular ring type having a predetermined thickness. A coupling hole 27 is through formed at a center of the baffle plate 20 to insert and couple the substrate support 15. The baffle plate 20 is formed such that its outer circumference surface corresponds to the inner circumference surface of the chamber 1.

An outer circumference of the baffle plate 20 is not limited to a circle, but may be formed in a square shape, etc. depending on a shape of the inner circumference surface of the chamber 1.

Accordingly, the outer circumference surface of the baffle plate 20 is closely adhered and coupled along the inner circumference surface of the chamber 1, and the inner circumference surface of the coupling hole 27 is closely adhered and coupled along the outer circumference surface of the substrate support 15, thus dividing a reaction space within the chamber 1 into an upper part and a lower part.

A step part 14 is formed at an inner surface of the fixing plate 12 to form the same surface as the inner circumference surface of the chamber 1 and thus, an inner surface of the step part 14 is closely adhered to the outer circumference surface of the baffle plate 20.

The baffle plate 20 can be pressed and coupled. In order to support a lower side surface of the baffle plate 20, a support jaw (not shown) of a predetermined height can be protruded and formed at the inner circumference surface of the chamber 1 or the outer circumference surface of the substrate support 15.

As illustrated in FIG. 2A, vents 25 are through formed in the baffle plate 20.

The vents 25 are parts which reaction gas passes through. The vents 25 are arranged and formed such that slots having predetermined lengths are spaced a distance apart in a radial shape.

As illustrated in FIG. 1, the cathode support shaft 13 of the cathode assembly 10 is positioned on a discharge path of reaction gas, thus obstructing a discharge of the reaction gas. Therefore, if the whole slots are formed at an equal interval in the baffle plate 20, the reaction gas is much more discharged through the slots positioned at an opposite side (i.e., an 'A' side of FIG. 1) of the cathode support shaft 13 causing no obstruction.

Accordingly, the reaction gas is non-uniformly discharged and thus, a state of plasma formed at an upper part of the substrate 50 cannot be kept uniform.

In order to prevent this, as illustrated in FIG. 2A, the vents 25 of the baffle plate 20 are formed by a plurality of slots arranged to be spaced apart in a radial shape. A gap between the slots is asymmetrically formed such that a spaced distance between the slots can be formed larger at an opposite side (i.e., an 'A' side of FIGS. 1 and 2A) of the cathode support shaft 13 than an upper side (i.e., a 'B' side of FIGS. 1 and 2A) of the cathode support shaft 13.

Accordingly, the baffle plate 20 has a relatively small vent area at the opposite side (i.e., the 'A' side) of the cathode support shaft 13, and reaction gas is relatively less discharged through the opposite side of the cathode support shaft 13 at which the spaced distance between the slots is larger formed, thereby enabling uniform discharge through the overall baffle plate 20.

FIGS. 2B and 2C illustrate different exemplary embodiments of a baffle plate. A slot is formed to have a different length to less discharge reaction gas through the vents 25 of the opposite side (i.e., the 'A' side) of the cathode support shaft 13.

That is, as shown in FIG. 2B, a baffle plate 21 is formed such that, as it goes to the opposite side (i.e., the 'A' side) of the cathode support shaft 13, a length L of a slot forming a vent 25 gets smaller in regular sequence from the outside and thus, a profile of the whole slots is formed in an oval shape.

FIG. 2C illustrates another exemplary embodiment of a baffle plate 22. As it goes to the opposite side (i.e., the 'A' side) of the cathode support shaft 13, a length of a slot forming a vent 25 gets smaller in regular sequence from the inside. Thus, a center point 22a of the whole slots does not match with a center of the coupling hole 27 and is eccentric to the opposite side (i.e., the 'A' side) of the cathode support shaft 13.

Accordingly, the baffle plate 22 has a smaller vent area at the opposite side (i.e., the 'A' side) of the cathode support shaft 13, thereby enabling the overall uniform discharge of reaction gas.

Figure 3:
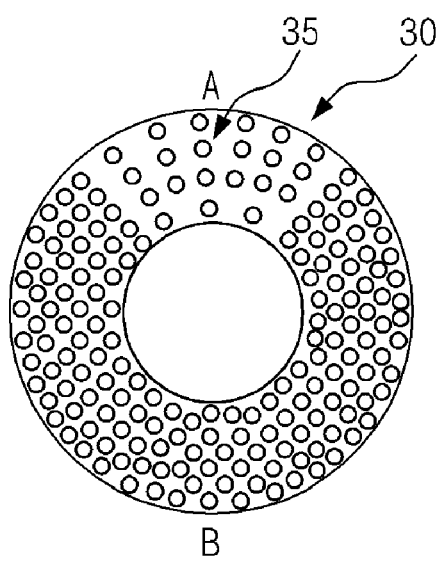
FIG. 3 is a plan view of another exemplary embodiment of a baffle plate of the present invention.

FIG. 3 is a plan view of another exemplary embodiment of a baffle plate of the present invention. Excepting a construction of a vent 35 through formed in a hole shape, this is identical with the aforementioned exemplary embodiment and thus, only a modified construction is described below.

The vent 35 is formed in a baffle plate 30 by a plurality of holes that are arranged to be spaced apart.

The holes are formed such that a spaced distance between the holes is larger at the opposite side (i.e., the 'A' side) of the cathode support shaft 13 than the top side (i.e., the 'B' side), and a vent area of the 'A' side is formed relatively smaller than a vent area of the 'B' side. Thus, reaction gas is relatively less discharged through the vent 35 of the 'A' side.

Figure 4:
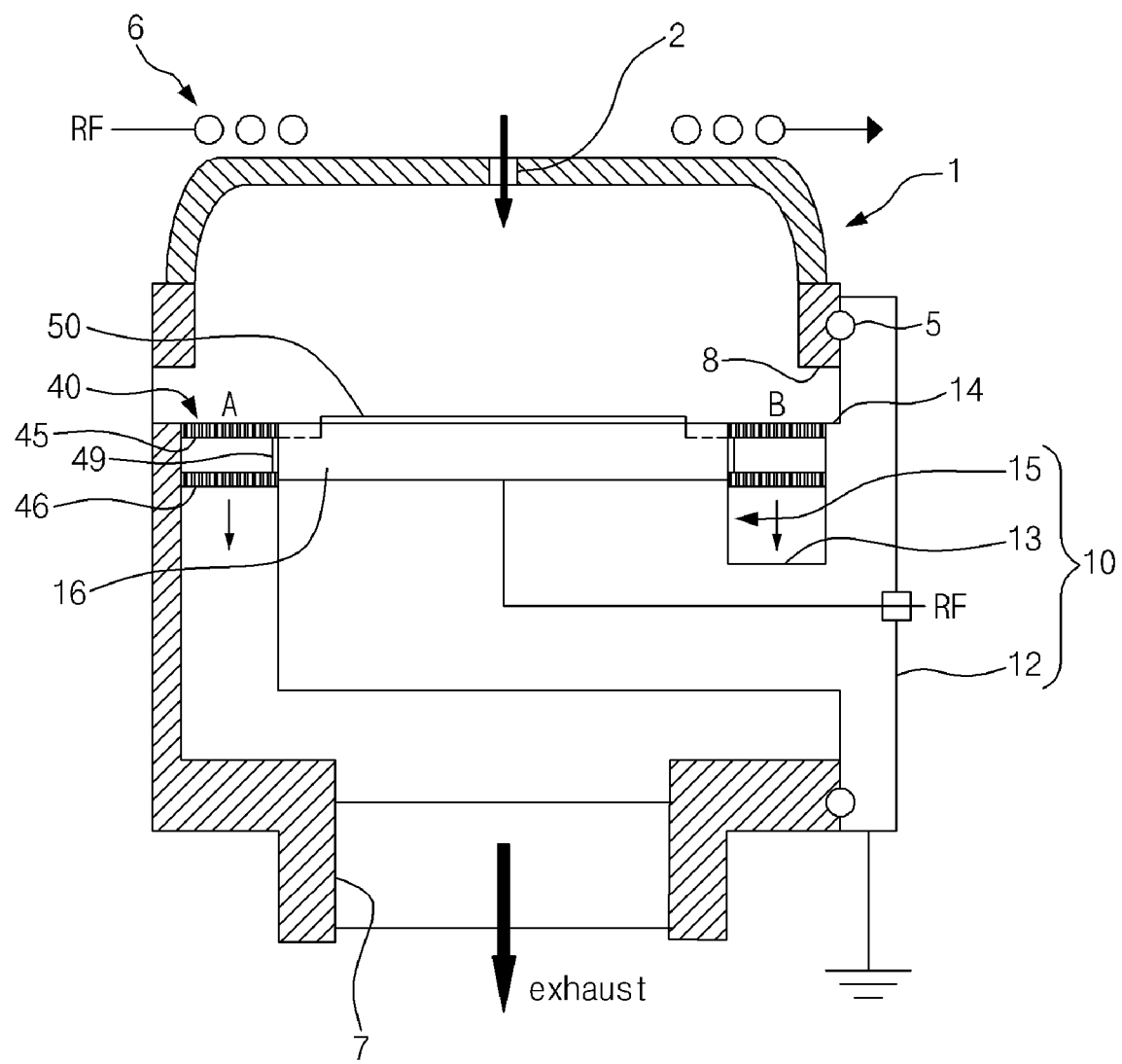
FIG. 4 is a schematic side section of another exemplary embodiment of the present invention.
Figure 5A:
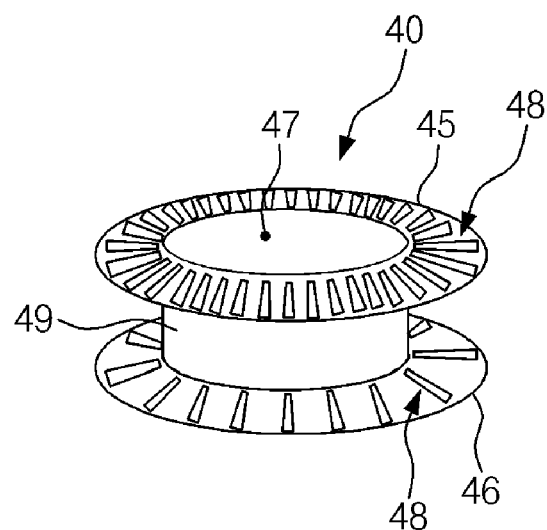
FIGS. 5A and 5B are side and top perspective views of an exemplary embodiment in which a baffle plate of the present invention is comprised of a first discharge plate and a second discharge plate.
Figure 5B:
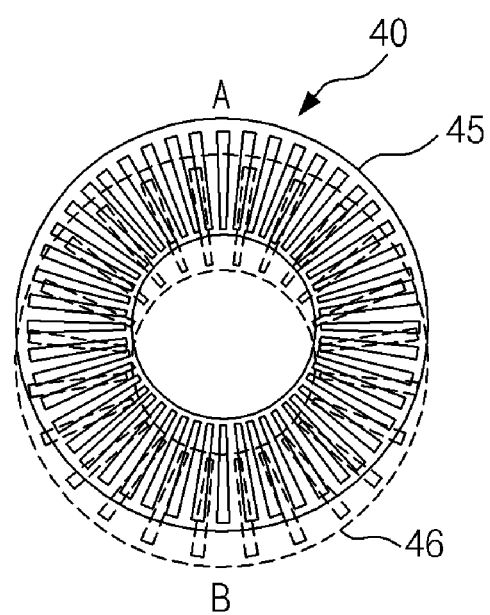

FIG. 4 illustrates a schematic side section having a baffle plate according to another exemplary embodiment of the present invention. FIGS. 5A,5B illustrate another exemplary embodiment of a baffle plate. Excepting a construction of a baffle plate 40 comprised of two top and bottom steps, this is identical with the aforementioned exemplary embodiment and thus, only a modified construction is described below.

As illustrated in FIGS. 5A,5B, the baffle plate 40 includes a support 49, a first discharge plate 45, and a second discharge plate 46. A coupling hole 47 is through formed in the support 49 to allow insertion and coupling of a substrate support 15 of a cathode assembly 10 to a center of the baffle plate 40. The first and second discharge plates 45 and 46 each are protruded and formed along outer circumference surfaces of upper and lower ends of the support 49.

The support 49 is out inserted and installed at the substrate support 15 in a cylindrical form.

Accordingly, as illustrated in FIG. 4, in the baffle plate 40, the first and second discharge plates 45 and 46 are out inserted to the substrate support 15 in an integrated state and thus, are installed in an up/down spaced state.

The outer circumference surfaces of the first and second discharge plates 45 and 46 each correspond to an inner circumference surface of a chamber 1.

Accordingly, an inner circumference surface of the coupling hole 47 is closely adhered to an outer circumference surface of the substrate support 15, and the outer circumference surfaces of the first and second discharge plates 45 and 46 are closely adhered and coupled with the inner circumference surface of the chamber 1 along a step part 14 of a fixing plate 12.

A support jaw (not shown) of a predetermined height can be protruded and formed at the inner circumference surface of the chamber 1 or the outer circumference surface of the substrate support 15 to support a lower side surface of the second discharge plate 46 in such a manner that the single-type baffle plates 20, 21, and 22 of FIGS. 2A to 2C are installed.

In another exemplary implementation, a baffle plate 40 does not include a support 49 and may be comprised of a first discharge plate 45 and a second discharge plate 46 that each can be out inserted separately to a substrate support 15 to be spaced apart up/down.

Desirably, the baffle plate 40 is formed to have slot-shaped vents 48 at the first and second discharge plates 45 and 46, and the first and second discharge plates 45 and 46 are formed to have different slot gaps, thus having different vent areas.

Forming the slot gap of the first discharge plate 45 smaller than the slot gap of the second discharge plate 46 is not limited to the scope of the present invention. The slot gap of the second discharge plate 46 may be formed relatively small.

Thus, after passing through the first discharge plate 45, reaction gas is secondarily discharged through the second discharge plate 46.

At this time, a space part formed between the first and second discharge plates 45 and 46 serves as a buffer, thus reducing obstruction from a substrate support shaft 13 of a cathode assembly 10 of an asymmetric structure. Thus, reaction gas can be more uniformly discharged.

Figure 6A:
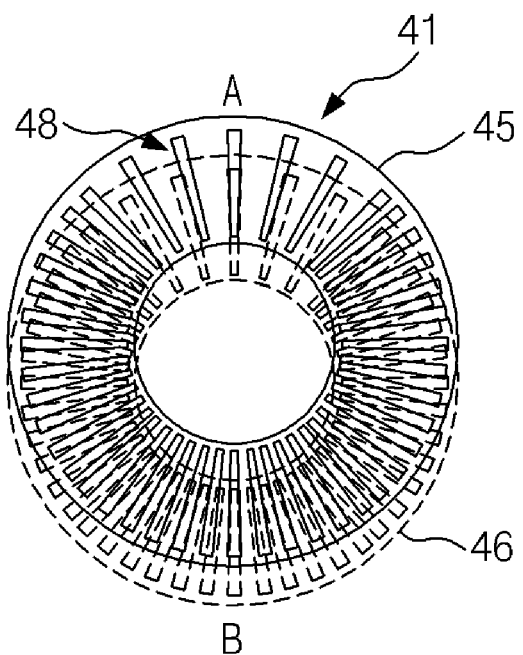
FIGS. 6A to 6C are top perspective views of respective different exemplary embodiments of the baffle plate of FIG. 4.
Figure 6B:
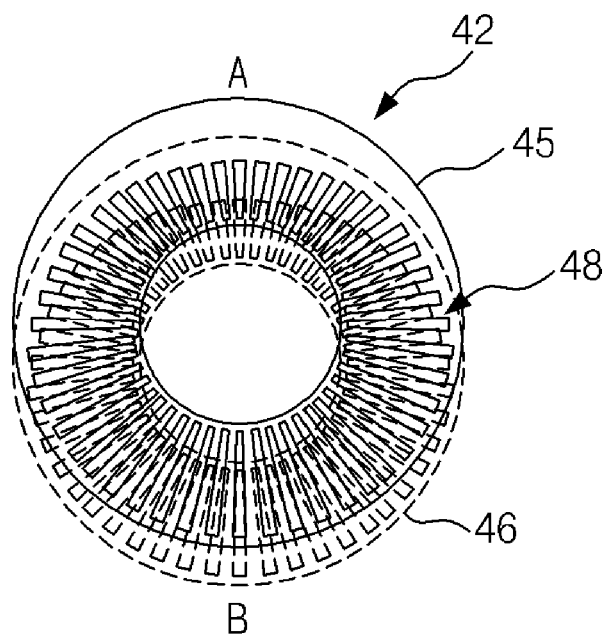
Figure 6C:
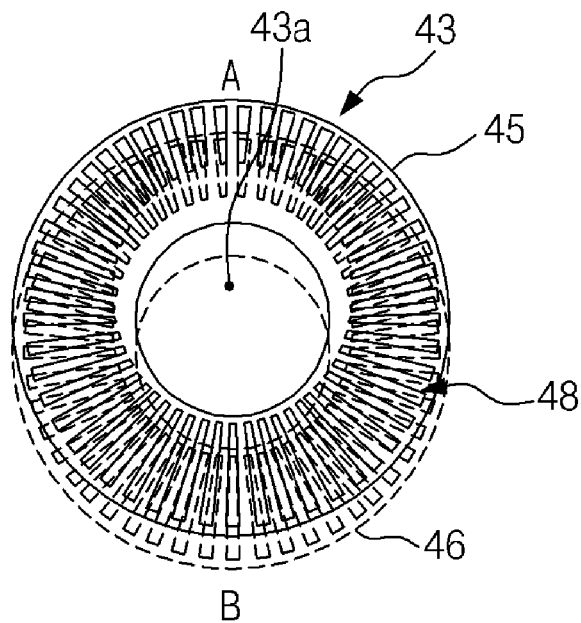

In FIGS. 6A to 6C, vents 48 are formed in a first discharge plate 45 identically with the exemplary implementations of FIGS. 2A to 2C. An 'A' side portion having a small vent area is positioned at an opposite side of a substrate support shaft 13.

Accordingly, the first discharge plate 45 of the baffle plate 40 is formed to have a relatively smaller vent area at an opposite side (i.e., an 'A' side) of the cathode support shaft 13 than a top side (i.e., a 'B' side) of the cathode support shaft 13, and reaction gas is relatively less discharged through the opposite side (i.e., the 'A' side) of the cathode support shaft 13 at which a spaced distance between slots is larger formed, thereby enabling uniform discharge through the overall baffle plate 40.

Figure 7:
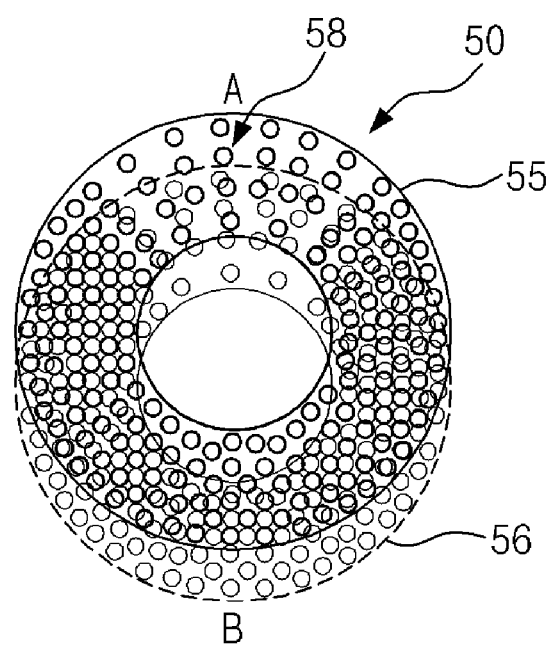
FIG. 7 is a top perspective view of another exemplary embodiment of the baffle plate of FIG. 5.

In FIG. 7, vents 58 are formed in a first discharge plate 55 of a baffle plate 50 in the same manner as the exemplary implementation of FIG. 3. A spaced distance between holes is formed larger at an 'A' side portion such that a smaller vent area is formed at an opposite side (i.e., an 'A' side) of the substrate support shaft 13.

Thus, a buffering effect of a spacing part formed between the first and second discharge plates 55 and 56 can lead to the improvement of the non-uniform discharge of reaction gas, and the first and second discharge plates 55 and 56 can compensate for the influence of the substrate support shaft 13, thereby enabling the overall uniform discharge.

The asymmetric arrangement of the vents 48 and 58 of the baffle plates 41, 42, 43, and 50 can be implemented only at any one of the first and second discharge plates 45,55 and 46,56 or can be implemented at all of the first and second discharge plates 45,55 and 46,56. Also, this is applicable even when the first and second discharge plates 45 and 46 have different vent areas as in the exemplary implementation of FIG. 5.

Figure 8A:
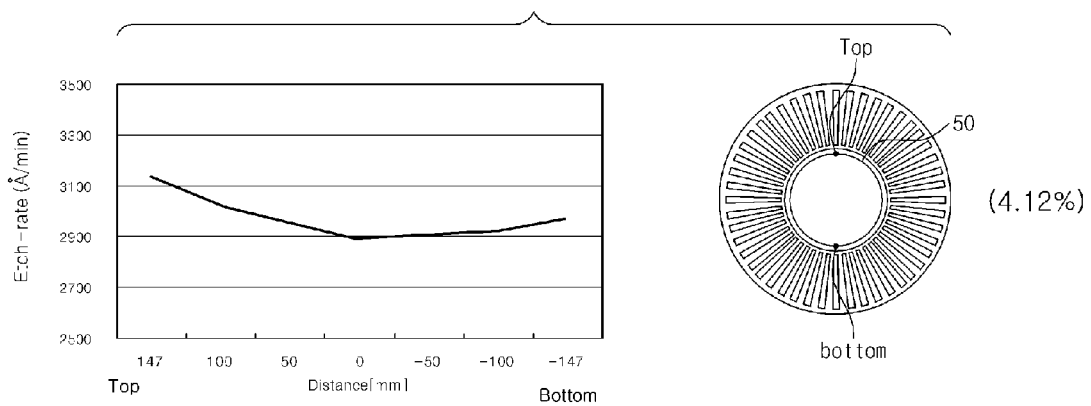
FIGS. 8A and 8B are a graph illustrating a comparison of experiment data on an etching rate of a plasma reactor depending on a baffle plate.
Figure 8B:
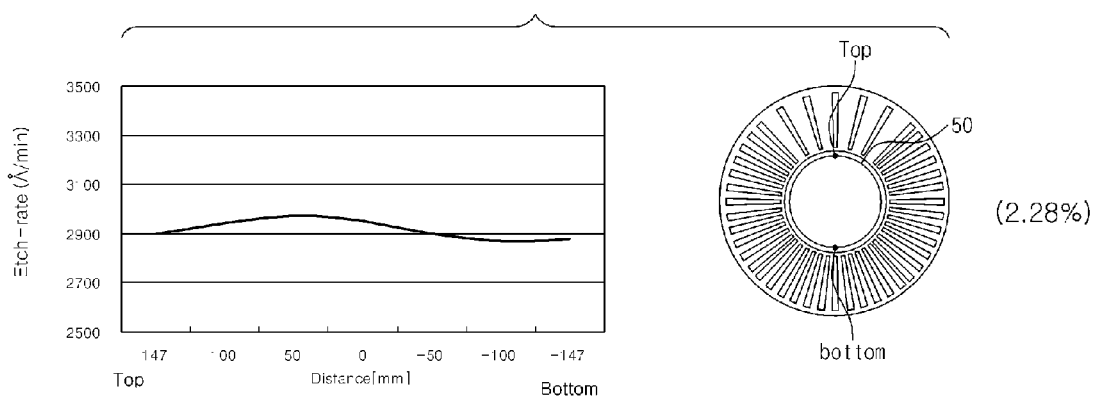

FIGS. 8A,8B are a graph illustrating a comparison of experiment data on an etching rate of a plasma reactor depending on a baffle plate.

In the graph, a horizontal axis denotes a measurement point on a virtual line connecting a top and bottom of a substrate 50 (i.e., a 300 mm wafer). A vertical axis denotes an etching rate (i.e., an etch depth per hour).

As illustrated in FIG. 8A, in the case of a baffle plate in which slots are arranged at an equal interval, an etching rate is equal to about 2,900 to 3,150 (Å/min) and thus, a variance rate is equal to about 4.12%.

However, As illustrated in FIG. 8B, in the case of a baffle plate in which slot gaps are asymmetrically arranged, an etching rate is equal to about 2,870 to 2,970 (Å/min) and thus, a variation rate is improved to about 2.28%.

Accordingly, in an exemplary embodiment of the present invention, the vents 25, 35, 48, and 58 are asymmetrically arranged and formed in the baffle plates 20, 21, 22, 30, 40, 41, 42, 43, and 50, thereby minimizing the influence of the substrate support 13 and enabling uniform discharge of reaction gas along the periphery of the substrate support 15. So, plasma formed on a surface of the substrate 50 can be kept uniform, thus being capable of enhancing the etching uniformity of the whole surface of the substrate 50 in the etching process, etc.

As above, the aforementioned exemplary embodiments are merely described as examples for description convenience and thus, are not intended to limit the claims. The same is applicable to all of other plasma vacuum processing devices such as sputtering or Chemical Vapor Deposition (CVD).

As described above, in exemplary embodiments of the present invention, first, there is an effect of minimizing process failure and improving process efficiency by uniformly discharging reaction gas along the periphery of a cathode assembly of an asymmetric structure and effectively discharging the reaction gas.

Second, there is an effect of remarkably enhancing the etching uniformity of a substrate and improving quality and productivity by keeping plasma formed on a substrate surface uniform and keeping an etching rate of the whole substrate surface uniform in an etching process, etc.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A plasma reactor comprising:
   a chamber forming a plasma reaction space;
   a cathode assembly comprising a substrate support, disposed substantially at the center of the chamber; and a baffle plate inserted concentrically between the inner surface of the side wall of the chamber and the substrate support such that the reaction space of the chamber is divided into upper and lower parts, and having a plurality of elongated vents arranged radially, at equal intervals and asymmetrically with respect to the center of the substrate support wherein the length of the vents changes in regular sequence from a maximal value at one vent location to a minimal value at another vent location opposite with respect to the center of the substrate support.

2. The reactor of claim 1, wherein the vents are arranged eccentrically with respect to the center of the substrate support.

3. A plasma reactor comprising:

a chamber forming a plasma reaction space;

a cathode assembly comprising a substrate support, disposed substantially at the center of the chamber; and a baffle plate inserted concentrically between the inner surface of the side wall of the chamber and the substrate support such that the reaction space of the chamber is divided into upper and lower parts, and comprising a first discharge plate disposed at the top of the substrate support and a second discharge plate disposed at the bottom of the substrate support, the first and second discharge plates having a plurality of elongated vents arranged radially, at equal intervals and asymmetrically with respect to the center of the substrate support wherein the length of the vents of the first and second discharge plates changes in regular sequence from a maximal value at one vent location to a minimal value at another vent location opposite with respect to the center of the substrate support.

4. The reactor of claim 3, wherein the first and second discharge plates of the baffle plate each are formed and integrated to the substrate support.

5. The reactor of claim 3, wherein the vents are arranged eccentrically with respect to the center of the substrate support.

* * * * *